(12) United States Patent
Koban

(10) Patent No.: US 6,937,721 B2
(45) Date of Patent: Aug. 30, 2005

(54) BROADBAND DRIVER CIRCUIT

(75) Inventor: Rudiger Koban, Krumpendorf (AT)

(73) Assignee: Infineon Technologies AG, München (DE)

( * ) Notice: Subject to any disclaimer, the term of this patent is extended or adjusted under 35 U.S.C. 154(b) by 322 days.

(21) Appl. No.: 10/353,520

(22) Filed: Jan. 28, 2003

(65) Prior Publication Data

US 2003/0142816 A1 Jul. 31, 2003

Related U.S. Application Data

(63) Continuation of application No. PCT/EP01/08316, filed on Jul. 18, 2001.

(30) Foreign Application Priority Data

Aug. 7, 2000 (DE) .......................... 100 38 373

(51) Int. Cl.[7] ................................. H04M 1/00
(52) U.S. Cl. .................... 379/399.01; 379/413
(58) Field of Search .................. 379/399.01, 93.01, 379/93.05, 93.07

(56) References Cited

U.S. PATENT DOCUMENTS

| 5,323,121 A | 6/1994 | Butler |
| 5,764,105 A | 6/1998 | Botker |
| 5,825,819 A | * 10/1998 | Cogburn ................ 379/399.01 |

FOREIGN PATENT DOCUMENTS

| DE | 28 57 233 C1 | 1/1984 |
| DE | 196 34 052 A1 | 3/1998 |
| DE | 196 34 052 C2 | 3/1998 |
| GB | 2 076 605 A | 12/1981 |

* cited by examiner

*Primary Examiner*—Jefferey F. Harold
(74) *Attorney, Agent, or Firm*—Jenkins, Wilson & Taylor, P.A.

(57) ABSTRACT

Broadband driver circuit for driving voice and data signals, having a current dividing circuit (37), which divides a current generated by a current source (38), in a manner dependent on a voice and data signal present at a signal input (21), into two base currents (Ib1, Ib2) for driving a first driver transistor (39) and a second driver transistor (40), the two driver transistors (39, 40) being constructed identically.

19 Claims, 5 Drawing Sheets

Transfer characteristic curve

Characteristic curve region A: $I_e = I_Q$

Characteristic curve region B: $I_e = U_{be}/R + I_b(\beta + 1)$

BROADBAND DRIVER CIRCUIT

RELATED APPLICATIONS

This application is a continuation of PCT patent application number PCT/EP01/08316, filed Jul. 18, 2001, which claims priority to German patent application number 10038373.4, filed Aug. 7, 2000 the disclosures of each of which are incorporated herein by reference in their entirety.

TECHNICAL FIELD

The invention relates to a highly linear integrated broadband driver circuit for driving voice and data signals.

BACKGROUND ART

DE 19634052 describes a method for controlling a push-pull output stage. The push-pull output stage has two output stage transistors which are controlled by control signals and are each assigned a sensor transistor in thermal coupling, two identical control currents being generated from the sensor currents supplied by the sensor transistors, which control currents are subtracted from the control signals of the output stage transistors.

DE 2857233 C1 describes a semiconductor power amplifier circuit with a protective circuit which is provided for protecting the output transistor from interference.

The ADSL method (ADSL: Asymmetrical Digital Subscriber Line) is a digital transmission method for twisted two-wire lines made of copper to the end subscriber in the local area for broadband applications. To date, the common signal transmission of DC voltage signals, analog voice signals and data signals has been effected in such a way that an independent signal path which is optimally designed for the respective requirements is provided for each signal component.

FIG. 1 shows such a conventional circuit concept according to the prior art. A first and second digital signal processor DSP in low-voltage technology serve for the signal processing of digital voice signals and digital data signals, respectively. The two digital signal processors $DSP_A$, $DSP_B$ are operated with a low supply voltage $V_{DD}$ of +5 V, for example. The digital signal processor $DSP_A$ for the digital voice signals is connected to a voice signal driver circuit for driving the DC voltage and analog voice signals. The voice signal driver circuit contains a preamplifier VV for amplifying the low voltage amplitudes of the voice signal. The gain of the preamplifier VV is defined by the dimensioning of the resistors R1 to R4. The preamplifier VV is of fully differential construction and has two signal outputs. The two signal outputs of the preamplifier VV are each connected to the noninverting input (plus) of two driver circuits T1, T2. The signal output of the two driver circuits T1, T2 is in each case fed back to the noninverting input of the driver circuit T1, T2.

For the DC voltage voice signal transmission, the voice signal driver circuit must be able to transmit signal voltages of up to 150 V for reasons of compatibility with older telephone system concepts, for example in order to transmit ringing signals. The voice signal driver circuit is therefore produced in a high-voltage technology and operated for example from a supply voltage of +60 V at the positive supply voltage connection and −70 V at the negative supply voltage connection. The signals transmitted by the voice signal driver circuit are conventional voice signals in a frequency range of 300 Hz to 3.4 kHz with a signal amplitude of 1 V, DC voltage signals in the range of 20 20 to 100 V, ringing signals in a frequency range of 20 to 50 Hz at a voltage amplitude of 70 V and teletex signals with a frequency range of 12 or 16 kHz at a signal amplitude of 5 V.

The signal outputs of the voice signal driver circuit of fully differential construction are connected to a low-pass filter TP, which decouples data signals with a relatively high frequency.

The digital voice [sic] processor $DSP_B$ provided for the digital data signals is connected to a data signal driver circuit. The data signal driver circuit according to the prior art, as is illustrated in FIG. 1, contains a first and second line driver T3, T4. The two noninverting inputs of the two line driver circuits T3, T4 are connected to the digital signal processor $DSP_B$. The two inverting inputs of the driver circuits T3, T4 are connected to one another via a resistor R5 and are respectively coupled to their signal outputs via resistors R6, R7. The driver circuits T3, T4 of the data signal driver circuit are connected via output resistors R8, R9 to a transformer connected downstream. The data signal driver circuit is subject to stringent linearity and signal bandwidth requirements. Therefore, the data signal driver circuit is conventionally realized using fast complementary bipolar technologies or BICMOS technologies. The complementarily constructed driver circuits T3, T4 of the data signal driver circuit have complementarily constructed driver transistors. Due to the dictates of technology, the driver circuit T3, T4 have [sic] a maximum operating voltage of ±15 V.

On account of the low operating voltages of the driver circuit T3, T4, the transmitting data signal must be stepped up to the required voltage value of 36 $V_p$ in a frequency range of 0.13 to 1.1 MHz. For this purpose, the transformer has a primary coil L1 and two secondary coils L2a, L2b, which are connected to one another via a capacitor C. The turns ratio between the secondary coils and the primary coil is two, for example, for the purpose of doubling the data signal voltages.

The outputs of the low-pass filter TP and of the transformer are connected in parallel to the connection lines for the terminal.

The line driver circuit arrangement according to the prior art as shown in FIG. 1 has some considerable disadvantages. The digital data signals require different driver circuits in each case. Moreover, the voice signal driver circuit and the data signal driver circuit are realized in different semiconductor technologies. Therefore, integration on a semiconductor chip is possible only with difficulty and the production costs for the circuit arrangement illustrated in FIG. 1 are relatively high.

A further disadvantage of the conventional circuit arrangement for driving voice and data signals which is illustrated in FIG. 1 is that, on account of the relatively low operating voltage of the data signal driver circuit, it is necessary to provide a transformer which cannot be integrated in a semiconductor chip. Said transformer requires a relatively large amount of space and can only be produced with a relatively high outlay.

A further disadvantage is that the voice signal driver circuit has to be produced in a high-voltage technology. The high-voltage technology necessitates relatively large component dimensions which lead to high parasitic capacitances. Furthermore, the transistors embodied in high-voltage technology have relatively high layer thicknesses and are thus relatively slow.

SUMMARY OF THE INVENTION

Therefore, the object of the present invention is to provide a broadband driver circuit which is both suitable for driving voice and data signals and which can be produced with a low outlay on circuitry.

This object is achieved according to the invention by means of a broadband driver circuit having the features specified in patent claim 1.

The invention provides a broadband driver circuit for driving voice and data signals, having:

a current dividing circuit, which divides a current generated by a current source, in a manner dependent on a voice and data signal present at a signal input, into two base currents for driving a first driver transistor and a second driver transistor, the two driver transistors being constructed identically, and the current dividing circuit of the broadband driver circuit having an NPN bipolar transistor, whose base connection is connected to a signal output of the control amplifier, whose collector connection is connected to the cascode transistor and whose emitter connection is connected to a base connection of the first driver transistor.

One advantage of the invention is that the driver transistors has [sic] two identically constructed driver transistors, in contrast to the complementarily constructed driver circuits according to the prior art. As a result of this, fewer method steps are required in the production of the driver circuit, so that there is an overall reduction of the production costs.

A further advantage of the broadband driver circuit according to the invention is that the driver circuit requires only one current source for driving the two driver transistors, so that the power loss decreases and, in the case of integration of the circuit, a saving of area is achieved.

In one preferred embodiment of the broadband driver circuit according to the invention, the two driver transistors have a high dielectric strength.

This affords the particular advantage that the broadband driver circuit according to the invention can be operated with a relatively high supply voltage, so that connecting a transformer downstream becomes superfluous. As a result of this, integration is facilitated and the production costs are lowered.

In a further preferred embodiment, the two driver transistors have a low transition frequency.

The driver transistors are preferably NPN bipolar transistors.

The physical dictates of NPN bipolar transistors mean that they are distinguished by a higher switching speed compared with PNP bipolar transistors.

The signal input of the broadband driver circuit is preferably connected to a control amplifier.

In a further preferred embodiment of the broadband driver circuit according to the invention, the current dividing circuit has a cascode transistor connected to the current source.

The cascode transistor of the current dividing circuit preferably has a base connection, which is connected to a voltage source, an emitter connection, which is connected to the current source, and a collector connection, which is connected to the base connection of the second driver transistor.

The base connection and the emitter connection of the two driver transistors are preferably connected to one another in each case via a resistor.

In a particularly preferred embodiment, the two driver transistors of the broadband driver circuit according to the invention each have a measuring transistor.

In a particularly preferred embodiment, the broadband driver circuit according to the invention has a quiescent current controller for controlling the quiescent current of the current source.

The provision of a quiescent current control affords the advantage that a temperature dependence of the broadband driver circuit according to the invention is avoided.

The cascode transistor is preferably a PNP bipolar transistor.

In an alternative embodiment, the cascode transistor is a PMOSFET.

In a particularly preferred embodiment, the current source is a PMOSFET or a PNP bipolar transistor.

This has the advantage that the current source transistor may have a lower transition frequency than an NPN transistor.

In a particularly preferred embodiment of the broadband driver circuit according to the invention, the two driver transistors are Darlington transistors.

The broadband driver circuit according to the invention preferably drives voice and data signals in a frequency band range from 0 to 1.1 MHz.

The emitter connection of the first driver transistor and the collector connection of the second driver transistor are preferably connected to a signal output of the broadband driver circuit.

The signal input of the broadband driver circuit according to the invention is preferably connected to a preamplifier.

The signal output of the broadband driver circuit according to the invention is preferably connected via a resistor to a terminal telephone connection line for the connection of a terminal.

Signal reflections on the terminal connection lines are avoided by virtue of the resistor.

The broadband driver circuit according to the invention is preferably used for driving xDSL signals.

The broadband driver circuit according to the invention is preferably used in a broadband SLIC circuit for xDSL signals.

Preferred embodiments of the broadband driver circuit according to the invention are described below with reference to the accompanying figures for explaining features that are essential to the invention.

BRIEF DESCRIPTION OF THE DRAWINGS

In the figures:

FIG. 5b shows a current characteristic curve of the preferred driver transistor illustrated in FIG. 5a.

FIG. 6b shows a current characteristic curve of the Darlington transistor illustrated in FIG. 6a.

DETAILED DESCRIPTION OF THE INVENTION

Figure 1:
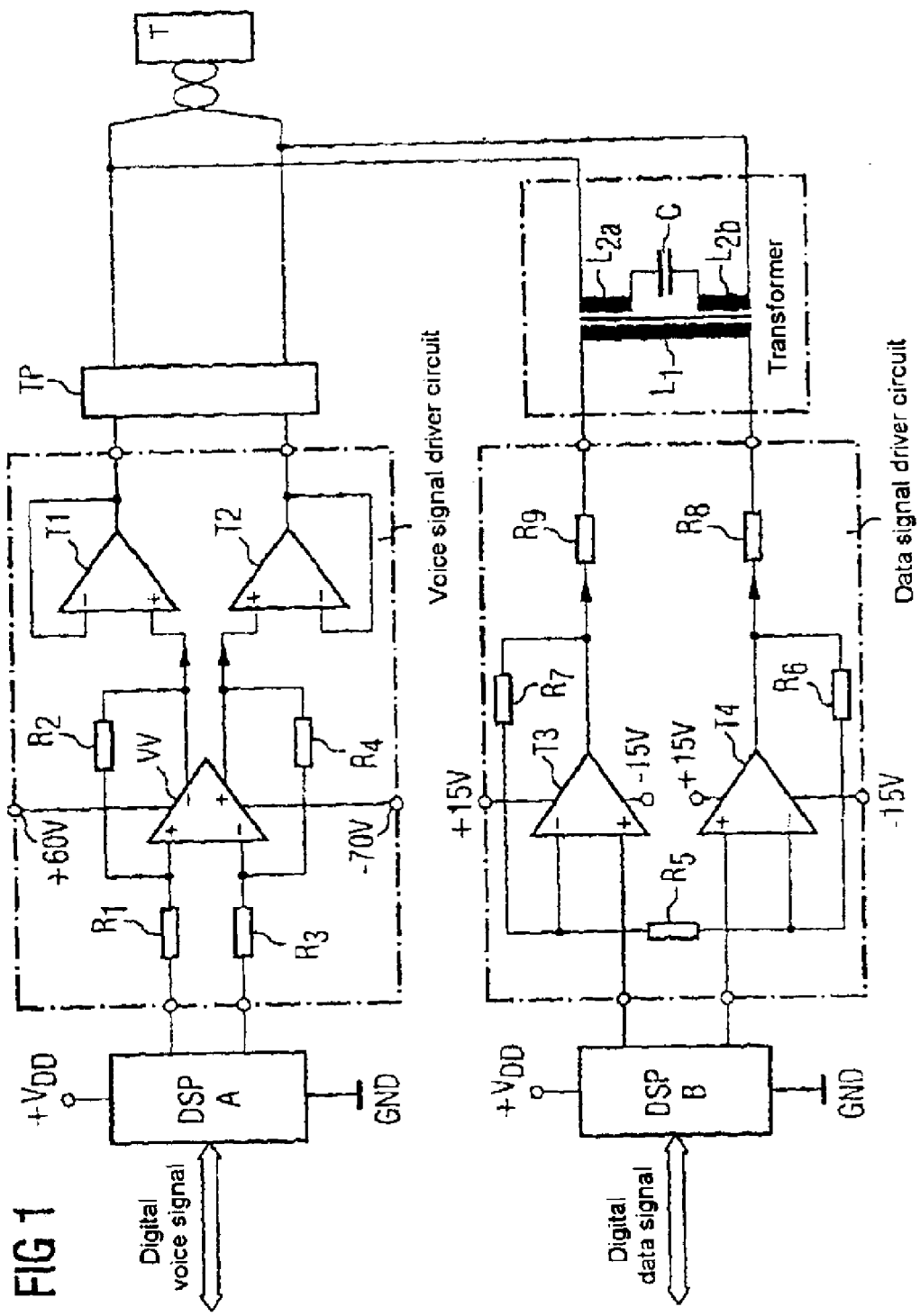
FIG. 1 shows a circuit arrangement for driving digital voice and data signals according to the prior art.
Figure 2:
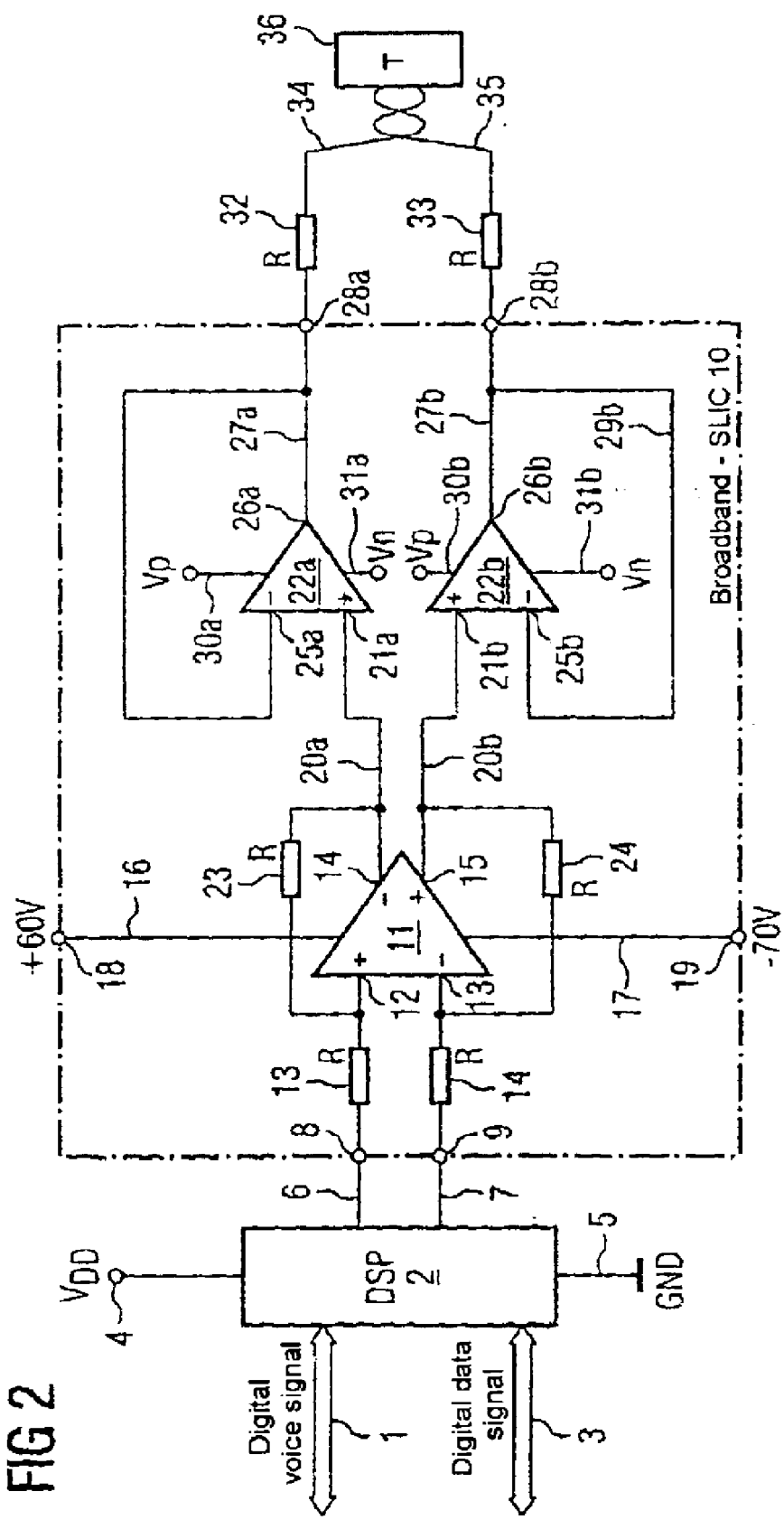
FIG. 2 shows a circuit arrangement for driving digital voice and data signals with a broadband SLIC circuit, which contains the broadband driver circuit according to the invention.

FIG. 2 shows a circuit arrangement for driving digital voice signals and digital data signals with a broadband SLIC circuit, which contains two broadband driver circuits according to the invention.

The digital voice signals are transmitted via signal lines 1 to a digital signal processor 2, which furthermore has a connection for the exchange of digital data signals via signal lines 3. The digital signal processor 2 has a supply voltage connection 4 for application of a positive supply voltage, for example 5 V. Furthermore, the digital signal processor 2 is grounded via a grounding connection 5. The digital signal processor 2 is connected via lines 6, 7 to two inputs 8, 9 of a broadband SLIC circuit 10.

The broadband SLIC circuit 10 is of fully differential construction and contains a preamplifier stage 11. The preamplifier stage 11 has a noninverting input 12 and an inverting input 13 and two signal outputs 14, 15. The noninverting signal input 12 is connected to the signal input 8 of the broadband SLIC circuit 10 via a resistor 13 and the inverting input 13 of the preamplifier 11 is connected to the second signal input 9 of the broadband SLIC circuit 10 via a resistor 14. The preamplifier 11 is supplied with voltage via supply voltage lines 16, 17 and supply voltage connections 18, 19 with a high supply voltage of +60 V at the positive supply voltage connection 18 and −70 V at the negative supply voltage connection 19. The signal output 14 of the preamplifier 11 is connected via a line 20 to the noninverting input 21a of a broadband driver circuit 22a according to the invention. The second signal output 15 of the preamplifier 11 is connected via a line 20b to the noninverting input 21b at the second broadband driver circuit 22b according to the invention. The connecting lines 20a, 20b are respectively connected via resistors 23, 24 to the inverting signal input 13 and the noninverting input 12 of the preamplifier 11. The signal gain of the preamplifier 11 is determined by the dimensioning of the resistors 13, 14, 23, 24.

The two broadband driver circuits 22a, 22b according to the invention which are contained in the broadband SLIC circuit 10 each have inverting inputs 25a, 25b. The signal outputs 26a, 26b are respectively connected via signal output lines 27a, 27b to the two signal outputs 28a, 28b of the broadband SLIC circuit 10. The signal output lines 27a, 27b are respectively fed back via feedback lines 29a, 29b to the inverting inputs 25a, 25b of the two broadband driver circuits 22a, 22b. The two broadband driver circuits 22a, 22b are each supplied with a positive supply voltage $V_p$ via voltage supply lines 30a, 30b and with a negative supply voltage $V_n$ via negative supply voltage lines 31a, 31b. On the output side, the broadband SLIC circuit 10 is connected via resistors 32, 33 to the connection lines 34, 35 for the connection of a terminal 36. The connection lines 34, 35 are, by way of example, twisted two-wire lines for the connection of a telephone terminal or modem 36.

As can be gathered from FIG. 2, the two broadband driver circuits 22a, 22b which form part of the broadband SLIC circuit 10 are used for the transmission both of voice signals and of data signals. A signal mixture comprising DC voltage signals, low-frequency voice signals and high-frequency data signals is in each case present at the two signal inputs 21a, 21b of the two broadband driver circuits 22a, 22b. The two driver circuits 22a, 22b are supplied with a supply voltage $\Delta V = V_p - V_n$ corresponding to the required voltage swing. The resistors 32, 33 provided in the terminal connection lines 34, 35 serve for suppressing signal reflections.

Figure 3:
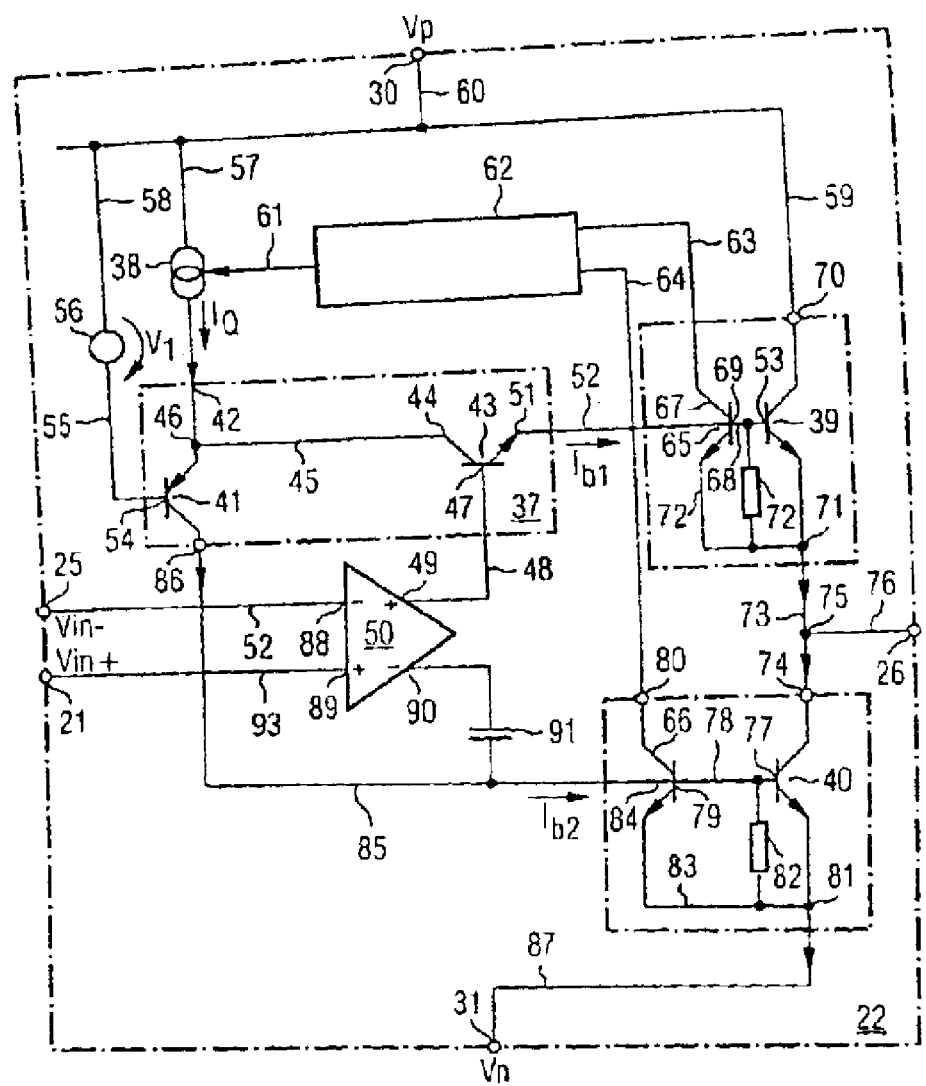
FIG. 3 shows a circuit diagram of the broadband driver circuit according to the invention.

FIG. 3 shows a preferred embodiment of the broadband driver circuit 22 according to the invention. The broadband driver circuit 22 according to the invention contains a current dividing circuit 37, which divides a current generated by a current source 38, in a manner dependent on a voice and data signal present at the signal input 21, into two base currents Ib1, Ib2 for driving a first driver transistor 39 and a second driver transistor 40. In this case, the two driver transistors 29 [sic] and 40 are constructed identically. The two driver transistors 39, 40 are preferably fast NPN bipolar transistors. The technologically identical construction of the two driver transistors 39, 40 makes it possible to obviate a number of production method steps during the production of the broadband driver circuit 22, so that there is an overall reduction of the production costs.

The current dividing circuit 37 contains a cascode transistor 41, which is connected to the current source 38 via a line 42. The current dividing circuit 37 furthermore contains an NPN bipolar transistor 43, whose collector connection 44 is connected to the emitter connection 46 of the cascode transistor 41 via a line 45. A base connection 47 of the NPN transistor 43 is connected via a line 48 to a signal output 49 of a control amplifier 50 of differential construction. The transistor 43 may alternatively be an NMOS transistor. The emitter connection 51 of the current dividing circuit 37 is connected to the base 53 of the first driver transistor 39 via a base connection line 52.

The base connection 54 of the cascode transistor 41 is connected via a line 55 to a component 56 for generating a fixed voltage V1. The current source 38 is connected via a line 57 and the voltage-generating component 56 is connected via a line 58 to a supply voltage line 59, which is connected via an internal line 60 to the positive supply voltage connection 30 of the broadband driver circuit 22 according to the invention.

The quiescent current of the current source 38 is adjustable by a quiescent current control circuit 62 via a setting line 61. The quiescent current control circuit 62 compensates for changes in quiescent current on account of temperature fluctuations. For this purpose, the quiescent current control circuit 62 is connected via current measuring lines 63, 64 to current measuring transistors 65, 66, which are integrated with the output driver transistors 39, 40. The base connection 53 of the first driver transistor 39 is connected to the base connection 68 of the current measuring transistor 67 via a base connection connecting line 69. The base connection connecting line 69 is connected via the line 52 to the current dividing circuit 37. The driver transistor 39 furthermore has a collector connection 70 connected to the power supply line 59. The emitter connection 71 of the first driver transistor 39 is connected to the base connecting line 69 via a resistor 72. Furthermore, the emitter connection 71 of the driver transistor 39 is connected to the emitter connection 72 of the associated current measuring transistor 65. The emitter connection 71 of the first driver transistor 39 is connected via a signal line 73 to the collector connection 74 of the second driver transistor 40. The signal line 73 has a branching node 75, which is connected via a line 76 to the signal output 26 of the broadband driver circuit 22 according to the invention.

The second driver transistor 40 furthermore has a base connection 77, which is connected via a base connecting line 78 to a base connection 79 of the associated current measuring transistor 66. The collector connection 80 of the current measuring transistor 66 is connected via the current measuring line 64 to the quiescent current control circuit 62. The emitter connection 81 of the second driver transistor 40 is connected to the base connecting line 78 via a resistor 82.

Furthermore, the emitter connection 81 of the driver transistor 40 is connected via a line 83 to the emitter 84 of the current measuring transistor 66. The base connection connecting line 78 is connected via a base current supply line 85 to the collector 86 of the cascode transistor 41 within the current dividing circuit 37. The emitter connection 81 of the second driver transistor 40 is connected via a supply voltage line 87 to the supply voltage connection 31 for the application of a negative supply voltage $V_n$.

The control amplifier 50 has an inverting input 88 and a noninverting input 89. Furthermore, the control amplifier 50 has, in addition to the noninverting signal output 48, an inverting signal output 90 which is connected via a capacitor 91 to the base current connection line 85 for the second driver transistor 40. This capacitor 91 serves for bypassing the cascode transistor 41 for high frequencies. The inverting input 88 of the control amplifier 50 is connected via an internal line 92 to the inverting input 25 of the broadband driver circuit 22 according to the invention. The noninverting input 89 is connected via an internal signal line 93 to the noninverting input connection 21 of the broadband driver circuit 22.

The two driver transistors 39, 40 are each designed as NPN bipolar transistors. They are preferably bipolar transistors having a relatively low transition frequency of 200 MHz which are distinguished by a particularly high dielectric strength. The two driver transistors 39, 40, which are connected in series via the line 73, are supplied with voltage [lacuna] the supply voltage connections 30, 31 with a positive supply voltage $V_p$ and a negative supply voltage $V_n$. On account of their high dielectric strength, the supply voltage applied to the two voltage connections 30, 31 may be correspondingly high. The broadband SLIC circuit 10, as is illustrated in FIG. 2, which contains two broadband driver circuits 22a, 22b according to the invention, can therefore process the high signal voltages of up to 150 V which are required for the DC voltage and voice signal transmission.

The current dividing circuit 37 divides the source current $I_Q$ generated by the single current source 38 into two base currents Ib1, Ib2 in a manner dependent on the input signal present at the signal input 21. As a result of the division of the source current $I_Q$ into the two base currents Ib1, Ib2, which flow via the lines 52 and 85, respectively, to the base connections 53, 77 of the two driver transistors 39, 40, the two driver transistors 39, 40 are alternately turned on and off.

Figure 5A:
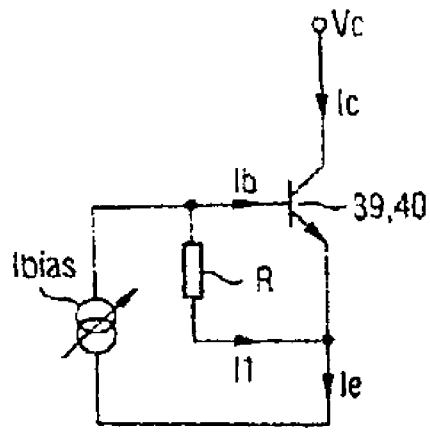
FIG. 5a shows a circuit diagram of a particularly preferred embodiment of the driver transistors contained in the broadband driver circuit.
Figure 5B:
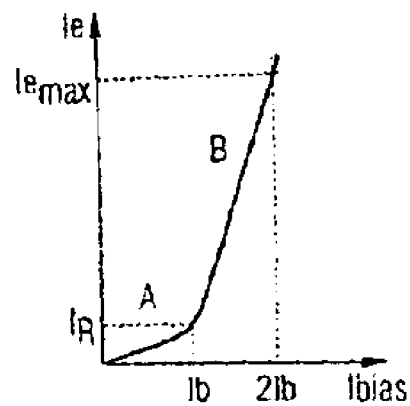

FIGS. 5a, 5b show the construction and the transmission current characteristic curve of the two driver transistors 39, 40.

The base current division by the current dividing circuit 37 is controlled by the control amplifier 50. The current magnitude of the source current $I_Q$ output by the current source 38 and of the two base partial currents Ib1, Ib2 is defined such that, for the case $I_{b1} \cong I_{b2}$, that is to say in the case of zero load current, the quiescent current $I_R$ lies somewhat above the bend point—illustrated in FIG. 5b—at the start of the linear characteristic curve region B. This affords the particular advantage that, on the one hand, the transmission transistor no longer operates in the nonlinear bend region of the transmission current characteristic curve and, on the other hand, when the maximum output current is reached, the respective other signal path is not completely deenergized.

The following holds true for the characteristic curve region A:

$$Ie=I_Q$$

The following holds true for the characteristic curve region B of the driver transistor:

$$Ie=U_{be}/R+I_b(\beta+1),$$

where $U_{be}$ is the base-emitter voltage, R is the resistance provided between base connection and emitter connection, $I_b$ is the base current supplied, and $\beta$ is a predetermined gain factor.

Since the base-emitter voltage $U_{be}$ and the current gain coefficient $\beta$ are temperature-dependent, it is necessary to readjust the quiescent current $I_R$ generated by the current source to the desired current magnitude. This is done with the aid of the quiescent current control circuit 62, which receives measurement currents for the readjustment of the quiescent current from the current measuring transistors 67, 66.

Figure 4:
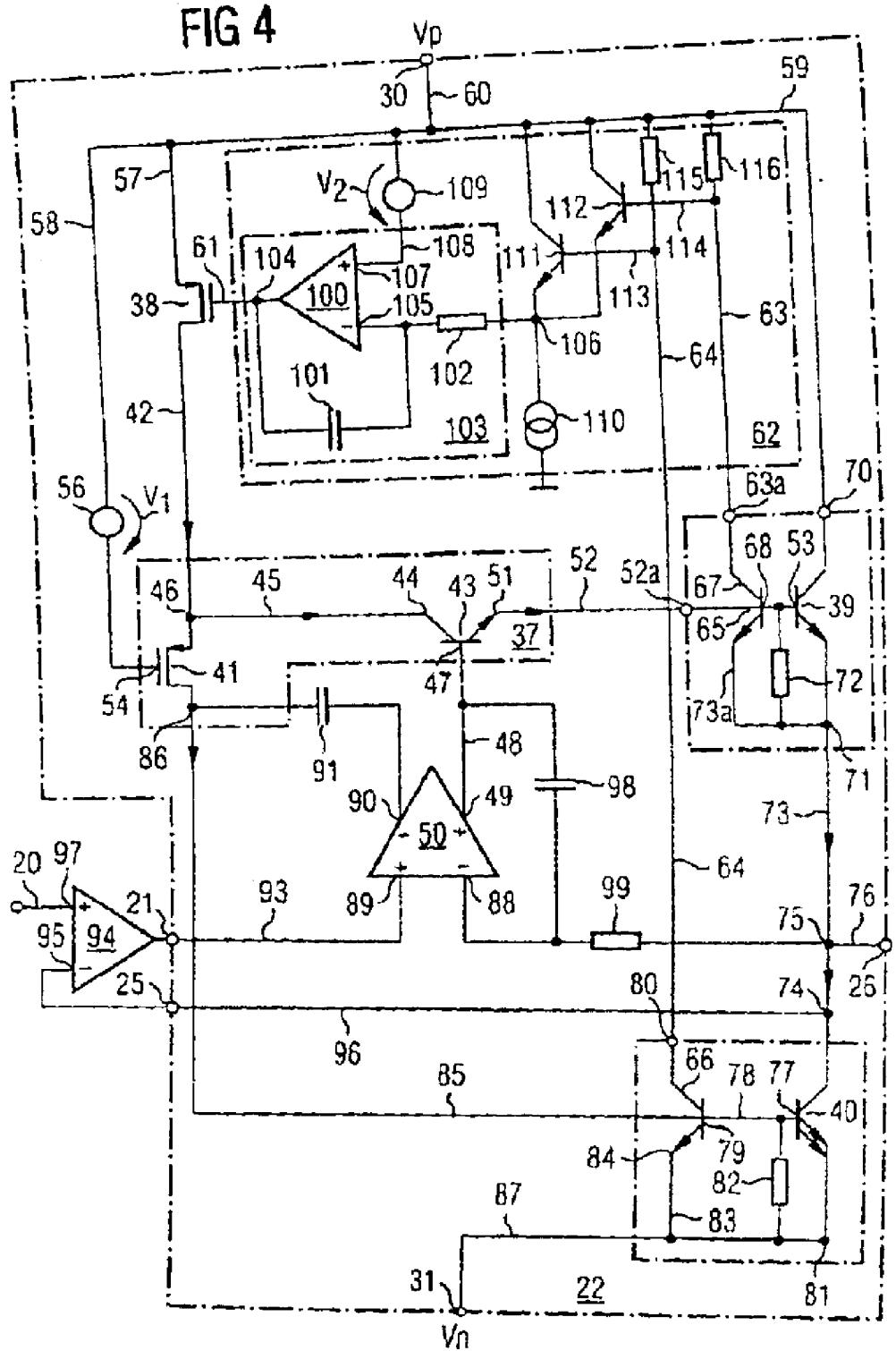
FIG. 4 shows a circuit diagram of a particularly preferred embodiment of the broadband driver circuit according to the invention.

FIG. 4 shows a particularly preferred embodiment of the broadband driver circuit 23 according to the invention.

In the particularly preferred embodiment shown in FIG. 4, the current source 38 is formed by a controlled PMOSFET transistor. The cascode transistor 41 in the current dividing circuit 37 also comprises a PMOSFET transistor. The driver transistors 39, 40 are formed by Darlington transistors, the construction of which is illustrated in transmission current characteristic curves in FIG. 6.

In the case of the embodiment illustrated in FIG. 4, the signal output 26 is fed back via the inverting input 25 and an additional amplifier stage 94. For this purpose, the additional amplifier stage 94 has an inverting input 95, which is connected to the inverting input 25 via a line 96. Furthermore, the additional amplifier stage 94 has a noninverting input 97, which is connected via the line 20 to the signal output 14 or 15 of the fully differential preamplifier stage 11. The control amplifier 50, which is connected as a voltage follower, is interleaved into the loop with the amplifier 94 in order to achieve a reduction of the output resistance of the broadband driver circuit 22.

In the particularly preferred embodiment shown in FIG. 4, the signal output 49 of the control amplifier 50 is fed back via a capacitor 98 to the inverting input 88. Furthermore, a resistor 99 is provided between the inverting input 88 and the connection 25. By virtue of the feedback comprising the capacitor 98 and the resistor 99, the control amplifier 50 is connected in such a way that oscillation is prevented and the circuit is stabilized overall.

FIG. 4 illustrates the construction of a particularly preferred quiescent current control 62. The quiescent current control circuit 62 contains an amplifier 100, a capacitor 101 and a resistor 102, which together form an integrator circuit 103. The signal output 104 of the integrator circuit 103 is connected via the setting line 61 to the gate connection of the current source MOSFET 38. The amplifier 100 has an inverting input 105, which is connected to a node 106 via the resistor 102. The amplifier 100 furthermore has a noninverting input 107, which is connected via a line 108 and a component 109 for generating a first voltage V2. The node 106 is connected to ground via a current source 110. Furthermore, the node 106 is connected to the emitter connections of two NPN transistors 111, 112 connected in parallel. The collector connections of the NPN transistors 111, 112 are connected to the positive power supply line 59. The base connections of the two NPN transistors 111, 112 connected in parallel are connected to the current measuring transistors 66, 67 via base connection lines 113, 114 and the current measuring lines 63, 64. The current measuring lines 63, 64 are likewise connected to the positive power supply line 59 via resistors 115, 116. The quiescent current control is effected by current/voltage conversion of the scaled output partial currents and the rectification thereof by means of the NPN transistors 111, 112. The respective smaller current is used for the integration by the integrator circuit 103. The output of the amplifier 100 controls the MOSFET transistor 38 operating as current source.

In the case of the preferred embodiment of the broadband driver circuit 22 according to the invention which is illustrated in FIG. 4, instead of customary bipolar transistors, Darlington transistors are used for the driver output transistors 39, 40 in order to achieve higher output currents of 0.25 ampere, for example.

Figure 6A:
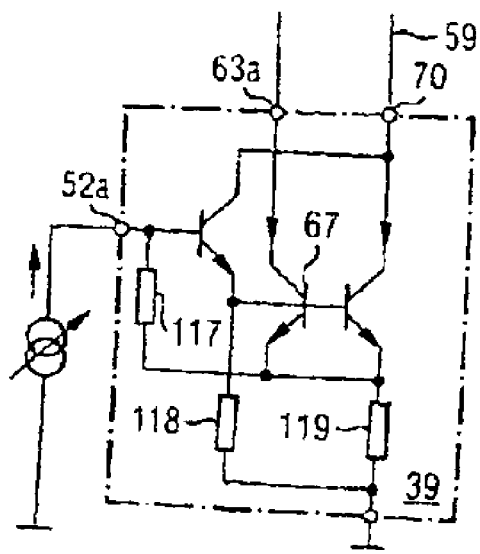
FIG. 6a shows a circuit diagram of a Darlington driver transistor.
Figure 6B:
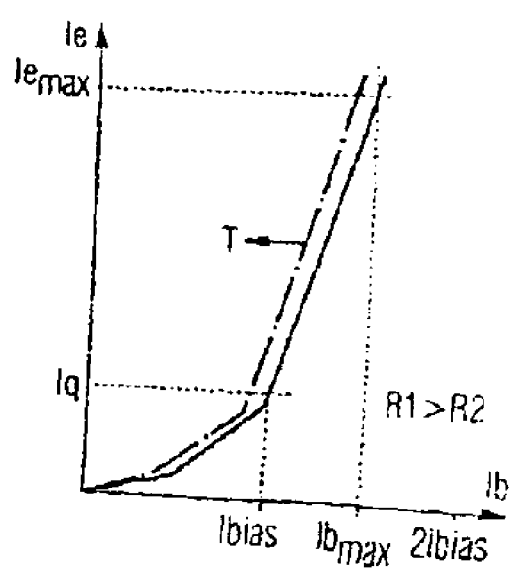

FIG. 6a shows the circuitry construction of such a Darlington transistor. FIG. 6b illustrates the associated current characteristic curve of the Darlington transistor. The Darlington transistor 39, as is illustrated in FIG. 6a, has a current transfer characteristic curve with three bend points. The way in which the resistors 117, 118, 119 are connected up makes it possible to define the bend points between the characteristic curve regions and the gradient thereof. The Darlington transistors are constructed identically and are driven alternately by means of base currents supplied by the current dividing circuit 37 via the lines 52, 85.

The driver circuit principle enables, relative to the comparatively low transition frequency of the driver transistors 39, 40 (of 200 MHz), a signal transmission up to a frequency of 1.1 MHz/$V_p$=38 V/100Ω [lacuna] a very high linearity of 60 dB during the signal transmission.

The driver transistors 39, 40 are constructed identically and are distinguished by a particularly high dielectric strength.

The broadband driver circuit 22 according to the invention is suitable for driving both DC voltage signals and low-frequency voice signals and high-frequency data signals.

Since the driver transistors 39, 40 are constructed identically, for example as NPN transistors, in contrast to complementary driver circuits, the broadband driver circuit 22 according to the invention can be produced with fewer method steps and is readily integrable. The quiescent current control circuit 62 compensates for temperature fluctuations.

The use of Darlington transistors as output driver transistors 39, 40 means that higher output currents can be supplied by the broadband driver circuit 22 according to the invention.

By virtue of integrated feedback circuits, the broadband driver circuit 22 according to the invention is particularly stable, so that oscillation of the circuit is suppressed. Since the broadband driver circuit 22 requires only one current source comprising a MOSFET 38, the power loss is minimized and chip area is saved in the case of integration of the [lacuna].

The broadband driver circuit 22 according to the invention is suitable as a driver circuit for any desired signals, and it is distinguished by a particularly high frequency bandwidth and a high linearity. In this case, the broadband driver circuit 22 according to the invention can be produced with lower production costs compared with driver circuits which are produced using high-voltage and complementary technology.

In particular, the broadband driver circuit 22 is suitable for use within a broadband SLIC circuit 10 for driving xDSL signals.

List of Reference symbols
1 Voice signal lines
2 DSP
3 Data signal lines
4 Power supply connection
5 Grounding line
6 Line
7 Line
8 Connection
9 Connection
10 Broadband SLIC circuit
11 Preamplifier
12 Noninverting input
13 Inverting input
14 Signal output
15 Signal output
16 Power supply line
17 Power supply line
18 Power supply terminal
19 Power supply terminal
20 Lines
21 Signal output lines
22 Broadband driver circuit
23 Resistor
24 Resistor
25 Inverting input
26 Signal output
27 Signal output line
28 Signal output of the broadband SLIC circuit 10
29 Feedback line
30 Positive power supply connection
31 Negative power supply connection
32 Resistor
33 Resistor
34 Connection line
35 Connection line
36 Terminal
37 Current dividing circuit
38 Current source
39 Driver transistor
40 Driver transistor
41 Cascode transistor
42 Line
43 Bipolar transistor
44 Connection
45 Line
46 Node
47 Base connection
48 Line
49 Signal output
50 Control amplifier
51 Emitter connection
52 Base current line
53 Base connection of the driver transistor 39
54 Connection of the cascode transistor
55
56 Voltage component
57 Line
58 Line
59 Positive power supply line
60 Line
61 Setting line
62 Control circuit
63 Current measuring line
64 Current measuring line
65 Current measuring transistor
66 Current measuring transistor 67 Current measuring transistor
68 Base connection
69
70 Collector connection
71 Emitter connection
72 Resistor
73 Line
73a Line
74 Node
75 Node
76 Line
77 Base connection
78 Base connecting line
79 Base connection
80 Collector connection
81 Emitter connection
82 Resistor
83 Line
84 Emitter connection
85 Base current line
86 Node
87
88 Inverting input
89 Noninverting input
90 Signal output
91 Capacitor
92
93 Line
94 Amplifier stage
95 Inverting input
96 Line
97 Noninverting input
98 Capacitor
99 Resistor
100 Amplifier
101 Capacitor
102 Resistor
103 Integrator circuit
104 Signal output
105 Inverting input
106 Node
107 Noninverting input
108 Line
109 Voltage component
110 Current source
111 Transistor
112 Transistor
115 Resistor
116 Resistor
117 Resistor
118 Resistor
119 Resistor

What is claimed is:

1. Broadband driver circuit for driving voice and data signals, having a current dividing circuit, which divides a current generated by a current source, in a manner dependent on a voice and data signal present at a signal input, into two base currents for driving a first driver transistor and a second driver transistor, the two driver transistors being constructed identically, and the current dividing circuit having an NPN bipolar transistor or an NMOS transistor, whose base connection or gate connection is connected to an output of the control amplifier, whose collector or drain connection is connected to the cascode transistor and whose emitter or source connection is connected to the base connection of the first driver transistor.

2. Broadband driver circuit according to claim 1, wherein the two driver transistors have a high dielectric strength.

3. Broadband driver circuit according to claim 1, wherein the two driver transistors have a low transition frequency.

4. Broadband driver circuit according to claim 1, wherein the two driver transistors are NPN bipolar transistors.

5. Broadband driver circuit according to claim 1, wherein the quiescent current of the current source is adjustable.

6. Broadband driver circuit according to claim 1, wherein the current dividing circuit has a cascode transistor connected to the current source.

7. Broadband driver circuit according to claim 1, wherein the signal input is connected to a control amplifier.

8. Broadband driver circuit according to claim 1, wherein the cascode transistor has a base connection, at which a fixed voltage is present, and a second connection, which is connected to the current source, and also a third connection, which is connected to the base connection of the second driver transistor.

9. Broadband driver circuit according to claim 1, wherein the base connection and the emitter connection of the two driver transistors are in each case connected via a resistor.

10. Broadband driver circuit according to claim 1, wherein the two driver transistors are in each case connected to a current measuring transistor.

11. Broadband driver circuit according to claim 1, wherein provision is made of a quiescent current control circuit for controlling the quiescent current of the current source.

12. Broadband driver circuit according to claim 1, wherein the cascode transistor is a PNP bipolar transistor.

13. Broadband driver circuit according to claim 1, wherein the cascode transistor is a PMOSFET.

14. Broadband driver circuit according to claim 1, wherein the two driver transistors are Darlington transistors.

15. Broadband driver circuit according to claim 1, wherein the broadband driver circuit drives voice and data signals in a frequency band range from 0 to 1.1 MHz.

16. Broadband driver circuit according to claim 1, wherein the emitter connection of the first driver transistor and the collector connection of the second driver transistor are connected to a signal output of the broadband driver circuit.

17. Broadband driver circuit according to claim 1, wherein the two driver transistors can be operated with a supply voltage of about 0 to 80 V.

18. Broadband driver circuit according to claim 1, wherein the signal input of the broadband driver circuit is connected to a further control amplifier.

19. Broadband driver circuit according to claim 1, wherein the signal output is connected via a resistor to a terminal connection line for the connection of a terminal.

* * * * *